United States Patent [19]

Davis et al.

[11] 4,326,290
[45] Apr. 20, 1982

[54] MEANS AND METHODS FOR MONITORING THE STORAGE STATES OF A MEMORY AND OTHER STORAGE DEVICES IN A DIGITAL DATA PROCESSOR

[75] Inventors: Sheila G. Davis, Los Angeles; Robert E. Franks, San Gabriel, both of Calif.; Alfred J. De Santis, Berwyn, Pa.

[73] Assignee: Burroughs Corporation, Detroit, Mich.

[21] Appl. No.: 85,200

[22] Filed: Oct. 16, 1979

[51] Int. Cl.$^3$ .................. G06F 11/00; G11C 29/00
[52] U.S. Cl. ............................... 371/21; 371/25
[58] Field of Search .................. 371/13, 21, 25, 31

[56] References Cited

U.S. PATENT DOCUMENTS

| | | | |
|---|---|---|---|
| 3,681,757 | 8/1972 | Allen et al. | 371/21 X |
| 3,838,264 | 9/1974 | Maker | 371/25 X |
| 3,982,111 | 9/1976 | Lerner et al. | 371/21 |
| 4,055,754 | 10/1977 | Chesley | 371/21 |

*Primary Examiner*—Jerry Smith
*Attorney, Agent, or Firm*—Nathan Cass; Kevin R. Peterson; David G. Rasmussen

[57] ABSTRACT

The internal states of a memory and other storage devices within a digital data processing system are made accessible for monitoring purposes using variable mode multi-bit shift register storage devices which are also used for the input-output register of the memory to be monitored. The inputs and outputs of the shift register storage devices are interconnected by gating means which may be selectably controlled to form separately selectable serial strings along which the bits of a selected string may be caused to be shifted to a monitoring unit for monitoring, diagnosing and/or correcting purposes and then returned, via the string, to their original locations in the respective shift register storage devices of the selected string, after which normal data processing operations can be resumed. Selectable storage states within the memory are made accessible by causing the monitoring unit to load the memory address register with a selected address for reading out the selected memory storage states which are to be monitored into the memory input-output register. The string containing the memory input-output register is then selected and the states thereof serially shifted to the monitoring unit for monitoring purposes. Corrections are made by returning corrected values, via the string, to the memory input-output register and then writing these corrected values into the memory at the addressed location.

11 Claims, 6 Drawing Figures

PRIOR ART

MEANS AND METHODS FOR MONITORING THE STORAGE STATES OF A MEMORY AND OTHER STORAGE DEVICES IN A DIGITAL DATA PROCESSOR

CROSS REFERENCE TO RELATED PATENT APPLICATIONS

This patent application contains subject matter relating to our commonly assigned copending patent applications Ser. No. 085,277, Ser. No. 085,278, and Ser. No. 085,388, all filed concurrently herewith on Oct. 16, 1979.

BACKGROUND OF THE INVENTION

This invention relates to improved means and methods for providing for the monitoring and diagnosing of digital circuits and memories with minimum burden on the data processing system.

SUMMARY OF THE INVENTION

In a particular preferred form of the invention, internal states within a data processing system are made accessible by providing serial monitoring paths or "strings" between particular internal logical storing devices which have the capability of operating in either a normal or monitoring mode. When it is desired to monitor the state of one or more of the storing devices on a selected string, the normal operation is interrupted and the storing devices on the selected string are then switched to their monitoring mode. Clocking is then controlled so that the internal states of the internal storing devices on the selected string are propagated, via the string, to a monitoring unit and then returned, again via the string, so that the internal storing devices on the selected string are returned to their original states, following which normal operation may resume. In the event an error is detected by the monitoring unit with respect to the state of one or more internal storing devices on the selected string, an appropriate indication of the error is provided and also, if desired, corrected states may be provided for substitution in the corresponding internal storing devices.

In order to make internal states within a memory readily accessible, the memory input-output register is likewise provided using one or more variable mode storage devices which are in turn connected in a respective string. When selected memory storage states are to be monitored, the monitoring unit loads the memory address register with a selected address chosen to read out the selected memory storage states which are to be monitored into the memory input-output register. The string containing the memory input output register is then selected and the states thereof serially shifted to the monitoring unit for monitoring purposes. Corrections can be made by returning corrected values, via the string, to the memory input-output register and then writing these corrected values into the memory.

The specific nature of the invention as well as other objects, features, advantages and uses thereof will become readily apparent from the following detailed description taken in conjunction with the accompanying drawings.

DETAILED DESCRIPTION

Like characters and numerals refer to like elements and components throughout the figures of the drawings.

Figure 1:
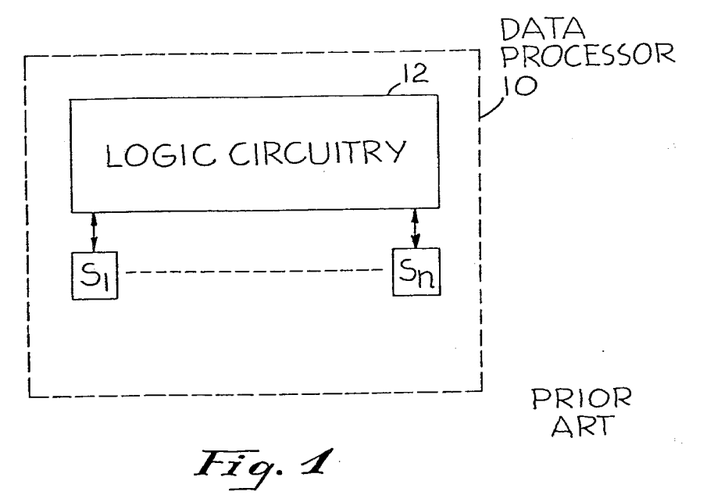
FIG. 1 is a generalized block diagram illustrating how storage devices are typically interconnected by logic circuitry in a conventional data processor.

Referring initially to FIG. 1, a conventional form of data processor 10 is illustrated typically including a plurality of storage device $S_1$-$S_n$ cooperating with logic circuitry 12 in providing data processing operations. Other conventional portions of a data processor are not shown in FIG. 1 for the sake of simplicity, but such portions may be considered to operate in cooperation with the storage device $S_1$-$S_n$ and logic circuitry 12 in a conventional manner. One purpose of the present invention is to provide improved means and methods for making accessible the internal states of data processor storage devices, such as illustrated by devices $S_1$-$S_n$ in FIG. 1, for monitoring diagnostic and/or correcting purposes with minimum burden on the data processing system. In the preferred embodiments of the present invention disclosed herein, it is of particular advantage to employ variable mode, multi-bit shift register storage devices such as illustrated by the variable mode, 4-bit shift register 15 illustrated in FIG. 2. Such a shift register 15 may be implemented, for example, using a commercially available Texas Instruments 74S194 integrated circuit chip.

Figure 2:
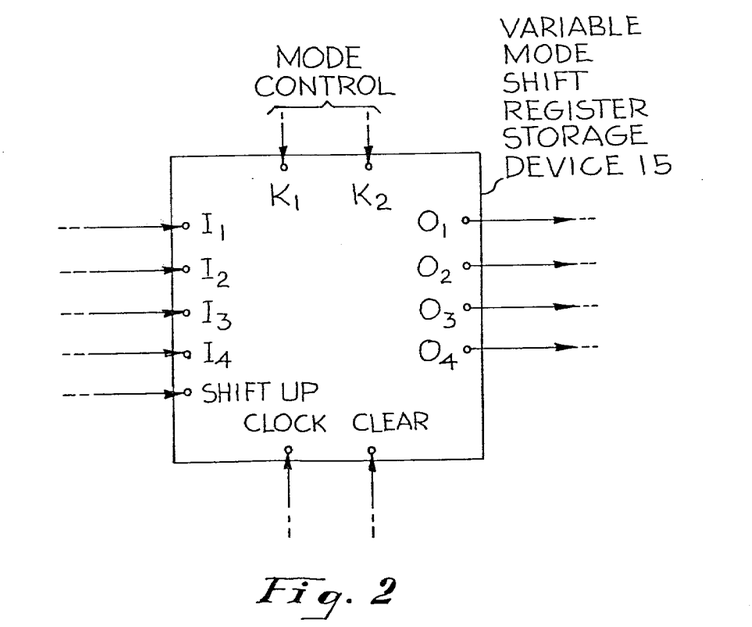
FIG. 2 is a block representation of a variable mode shift register storage device which is preferably employed for providing digital storage in a data processing system incorporating the invention.

As shown in FIG. 2, the 4-bit variable mode shift register 15 includes: inputs $I_1$, $I_2$, $I_3$ and $I_4$; respective outputs $O_1$, $O_2$, $O_3$ and $O_4$; a "Shift-Up" input for receiving input signals to be shifted through the register; a clear input for use in clearing the shift register to all "0" values; a clock input for receiving a clock signal whose leading edge, for example, is used to initiate shift register operations; and mode control inputs $K_1$ and $K_2$ to which mode control signals are applied for determining the particular mode in which the shift register is to operate. Typically, the mode control signals applied to inputs $K_1$ and $K_2$ may have the following meanings: $K_1K_2=00=$No Change; $K_1K_2=11=$Parallel Load; and $K_1K_2=01=$Shift Up.

It will be understood that when $K_1K_2=11=$Parallel Load, input binary signals are loaded in parallel into respective inputs $I_1$-$I_4$ of shift register 15 in response to the leading edge of an applied clock. When so loaded the respective binary values thereof appear at respective outputs $O_1$–$O_4$. Accordingly, in the Parallel Load mode ($K_1K_2=11$) shift register 15 in FIG. 2 functions as four independent clock-controlled storage devices (similar to flip-flops or latches) having respective inputs $I_1$, $I_2$, $I_3$ and $I_4$ and respective outputs $O_1$, $O_2$, $O_3$ and $O_4$ connected to logic circuitry 12 in FIG. 1 in a customary manner. In the No Change mode ($K_1K_2=00$), the shift register values remain unchanged regardless of the binary signals applied to inputs $I_1$–$I_4$. In the Shift Up mode ($K_1K_2=01$), serial shifting occurs upwardly in response to each clock—that is, from the Shift Up input to $I_4$, from $I_4$ to $I_3$, from $I_3$ to $I_2$ and from $I_2$ to $I_1$; and correspondingly from $O_4$ to $O_3$, from $O_3$ to $O_2$ and from $O_2$ to $O_1$. The Parallel Load and No Change modes are used during normal data processing operations, while the Shift Up mode is used during monitoring operations as will hereinafter be described in further detail.

Figure 3:
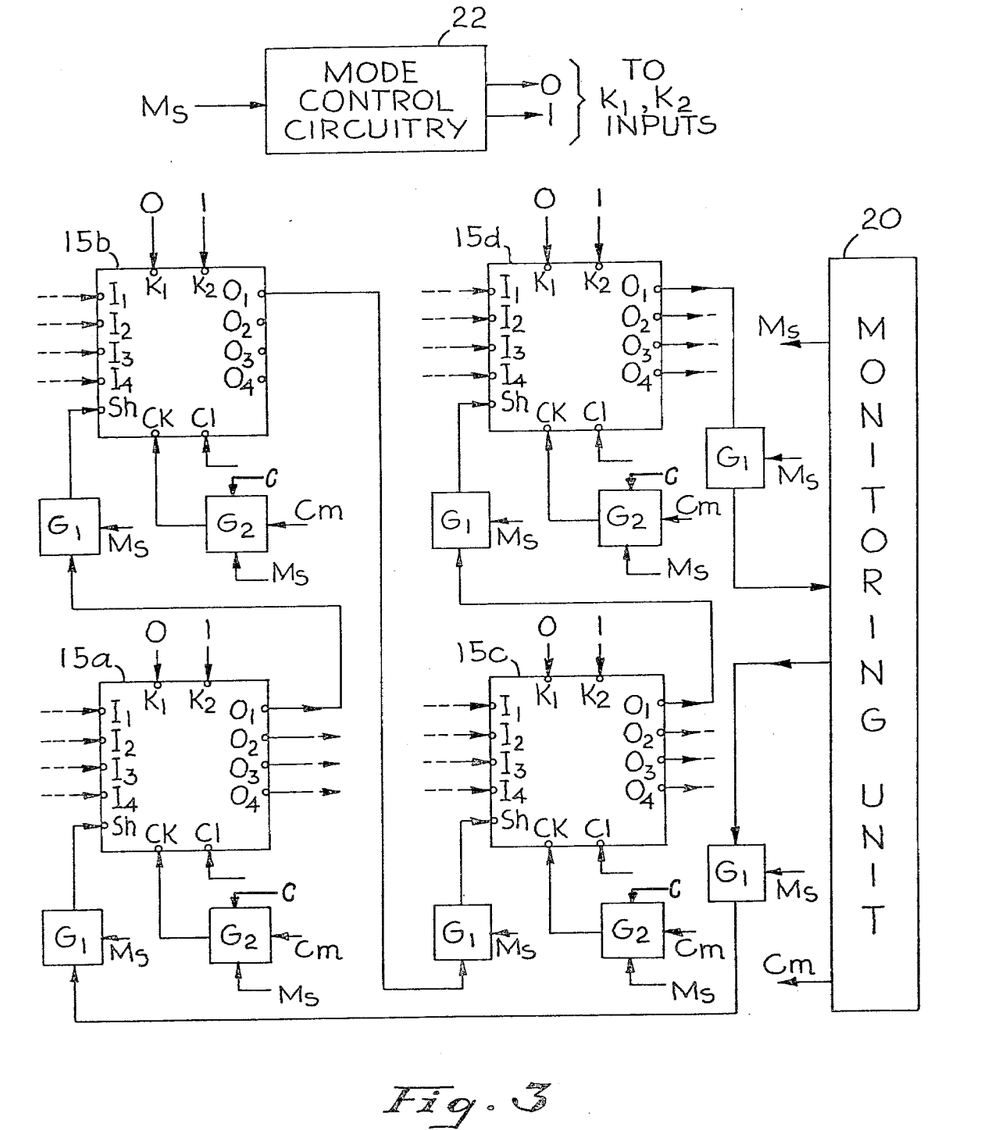
FIG. 3 is a block diagram illustrating how the variable mode shift register storage device of FIG. 2 may be interconnected in accordance with the invention to form a String for cooperation with a monitoring unit.

FIG. 3 illustrates a preferred manner in accordance with the invention for interconnecting variable mode shift register storage devices, such as illustrated in FIG. 2, into a "String" for cooperation with a monitoring unit 20. Although FIG. 3 illustrates only a single String comprised of four 5-bit variable mode shift register devices 15a–15d, it will be understood that many such Strings are ordinarily provided in a data processor, and that more or less shift register storage devices may be provided in each String.

Now considering FIG. 3 in more detail, it will be understood that variable mode storage devices 15a–15d are interconnected by gating circuitry $G_1$ so as to form a String when the gating circuitry $G_1$ is enabled by a monitor enable signal $M_s$ provided by a monitoring unit 20. The monitor enable signal $M_2$ is also used to cause mode control circuitry 22 to provide Shift Up mode control signals ($K_1K_2=01$) to the mode control inputs $K_1K_2$ of shift register storage devices 15a–15d, thereby causing serial feeding of the respective sixteen states of the four 4-bit shift register storage devices 15a–15d to the monitoring unit 20 and then back again to their respective shift register storage devices 15a–15d under the control of a monitor clock $C_m$ provided by the monitoring unit 20. The monitor clock $C_m$ is applied to the clock input of each of shift register devices 15a–15d via clock gate circuitry $G_2$ which in response to monitoring control signal $M_s$ disconnects the normally provided processor clock C while permitting the monitoring clock $C_m$ to be applied therethrough to the clock inputs of the shift register storage devices of the String. Since the four shift register devices 15a–15d in FIG. 3 form a 16-bit String, it will be understood that a total of 20 monitoring clocks $C_m$ are required to feed the sixteen states of the four shift register devices 15a–15d to the monitoring unit 20 for monitoring diagnostic and/or corrective purposes and then back again so that the shift register devices are returned to their original states or to corrected states, after which normal operations may be resumed. It will be evident from FIG. 3 that the String comprises the 16 bits constituted by the shift register outputs $O_{1a}$, $O_{2a}$, $O_{3a}$, $O_{4a}$, $O_{1b}$, $O_{2b}$, $O_{3b}$, $O_{4b}$, $O_{1c}$, $O_{2c}$, $O_{3c}$, $O_{4c}$, $O_{1d}$, $O_{2d}$, $O_{3d}$, $O_{4d}$, wherein the a, b, c and d subscripts identify the respective one of shift registers 15a, 15b, 15c and 15d to which the outputs $O_1$, $O_2$, $O_3$ and $O_4$ correspond.

Figure 4:
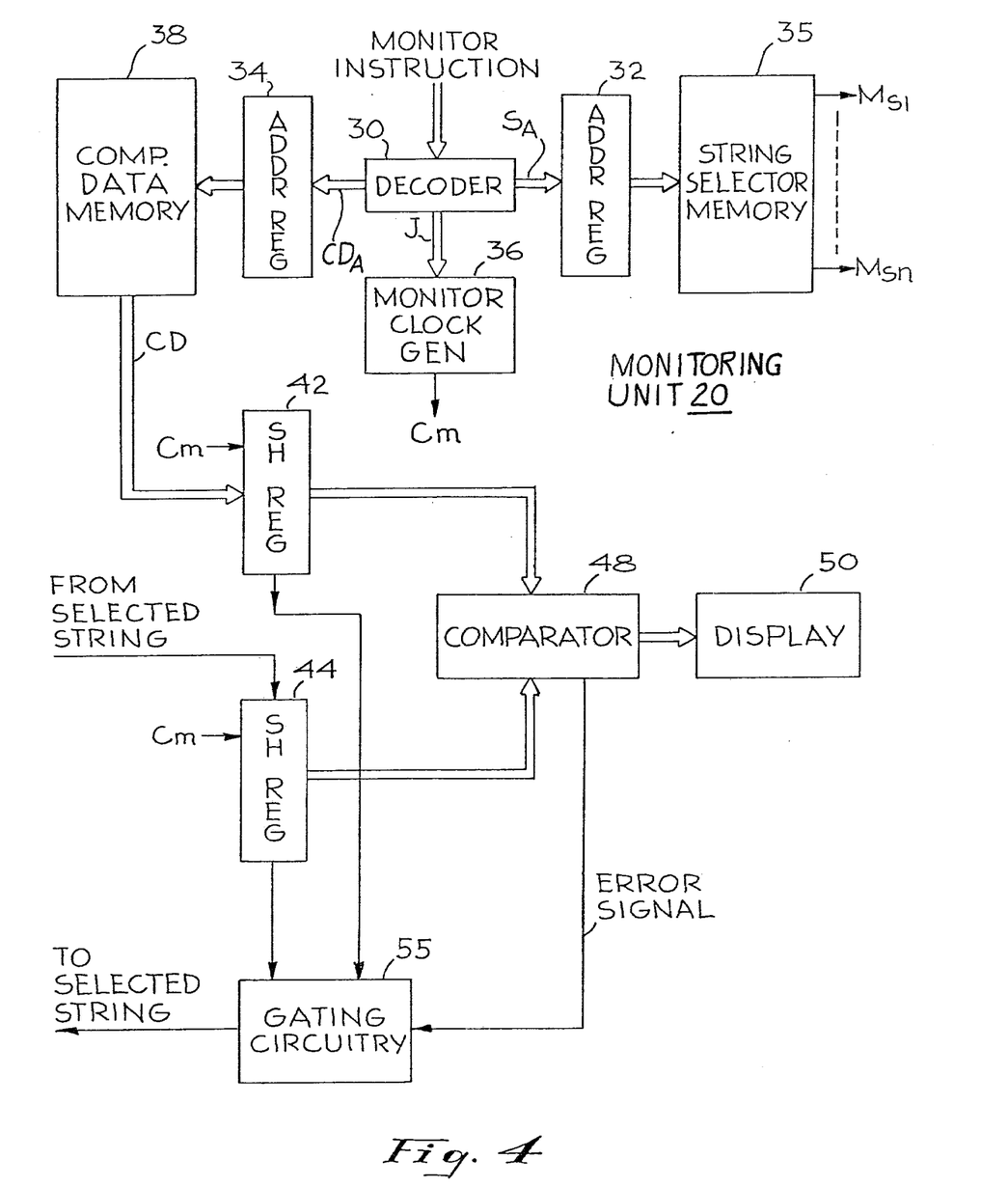
FIG. 4 is a block diagram illustrating an example of a monitoring unit which may be employed in accordance with the invention.

Reference is now directed to FIG. 4 which illustrates one type of monitoring unit 20 which may be employed. As indicated in FIG. 4, the operation of the monitoring unit 20 is initiated by a Monitor Instruction applied to a decoder 30 which derives therefrom a String address $S_A$ and a comparison data address $CD_A$ which are supplied to address registers 32 and 34, respectively.

The String address $S_A$ applied to address register 32 in FIG. 4 selects from a String selector memory 35 a particular one of monitor enable signals $M_{s1}$–$M_{sn}$ for enabling the gating circuitry $G_1$ and $G_2$ of a selected String for feeding the shift register states of the shift register storage devices making up the selected String to the monitoring unit 20 and back again as described previously in connection with FIG. 3.

The decoder 30 also applies a count signal J to a monitor clock generator 36 for producing a predeterminednumber of monitor clocks which is determined by the number of bits in the selected String.

Still with reference to FIG. 4, the comparison data address $CD_A$ applied to address register 34 selects from a comparison data memory 38 a particular comparison data word CD having values corresponding to the states of the shift register storage devices of the selected String, the selected comparison data word being applied to a shift register storage device 42 which may be of conventional form. Since the four 4-bit shift register storage devices provide a total of sixteen bits to be monitored, the corresponding comparison data word will likewise have sixteen bits and the shift register storage device 42 will accordingly be adapted to store at least sixteen bits. The bits of the selected String (provided as illustrated in FIG. 3) are serially loaded into a shift register storage device 44 which may also be of conventional form, and likewise is adapted to accommodate the sixteen bits fed thereto by the shift register storage devices of the selected String under the control of the monitor clock $C_m$.

The timing of the loading of the shift register devices 42 and 44 is chosen so that the sixteen bits of the selected String and the corresponding comparison data word are simultaneously stored in shift register storage devices 42 and 44, respectively, at which time they are then compared by a comparator 48 and the results of the comparison indicated by a display 50 or other appropriate device. Meanwhile, the sixteen bits from the selected String continue to be shifted under the control of monitor clock $C_m$ and after a total of 16 clocks are returned via gating circuitry 55 back to their respective shift register devices 15a–15d in FIG. 3. In the event the comparator 48 detects an error between one or more bits of the selected String and the corresponding comparison data word, the comparator 48 provides an appropriate signal to gating circuitry 55 which causes the bits of the comparison data word (or any desired number of bits thereof) in shift register storage device 42 to be shifted to the shift register storage devices of the selected String instead of those in shift register storage device 44.

Figure 5:
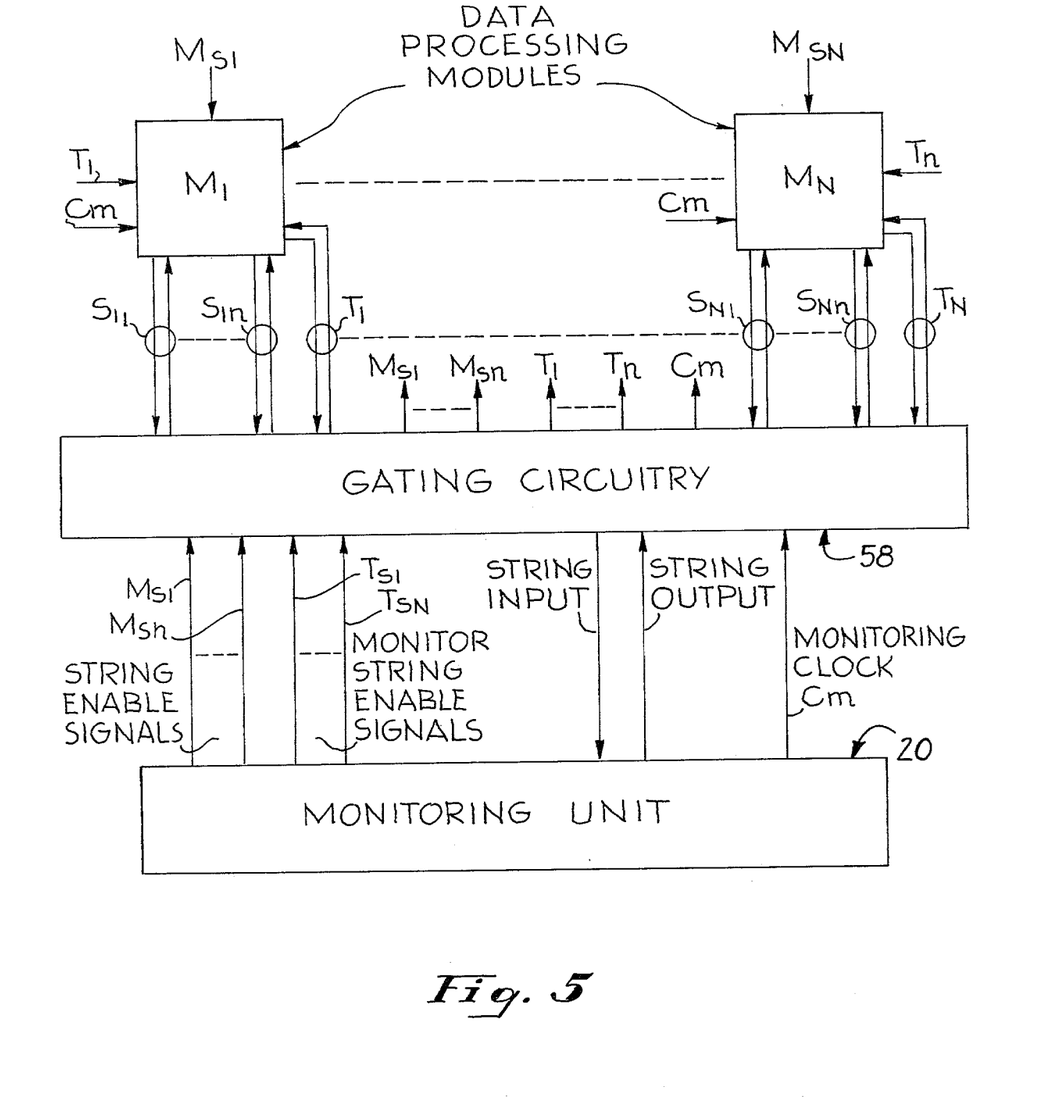
FIG. 5 is a block diagram illustrating how the present invention may advantageously be employed with a modular organized data processor.

Particular advantage may be made of the above described monitoring approach by organizing a data processor in the manner generally illustrated in FIG. 5. As indicated, a data processor may be implemented as a plurality of separately operating modules $M_1$–$M_N$. For the sake of simplicity, the various interconnections required between the modules for non-monitoring data processing purposes are not shown since they are not pertinent to the present invention. For the purposes of the present invention, it is sufficient to understand that, as illustrated in FIG. 5, each of modules $M_1$–$M_N$ is provided with its own set of one or more Strings of shift register storage device of the type illustrated in FIGS. 2 and 3. Each such String is indicated in FIG. 5 by the capital letter "S" having a first subscript denoting the module number and a second subscript denoting the particular String of that module. For example, $S_{12}$ would designate the second String of module M1. It will be understood that such an arrangement of Strings as illustrated in FIG. 5 permits each module, via gating circuitry 58, to be separately and individually monitored, corrected and/or diagnosed.

It is additionally of advantage to provide one or more of the modules in FIG. 5 with at least one monitoring String, these being indicated in FIG. 5 by the capital letter "T" having a subscript denoting the corresponding module. These monitoring Strings are provided in a manner so that the shift register storage devices of which each is comprised are not themselves involved in data processing operations, but rather are used for monitoring purposes within their respective modules. Accordingly, this permits each module to be individually monitored via a respective monitoring String while normal data processing operations are occurring.

Figure 6:
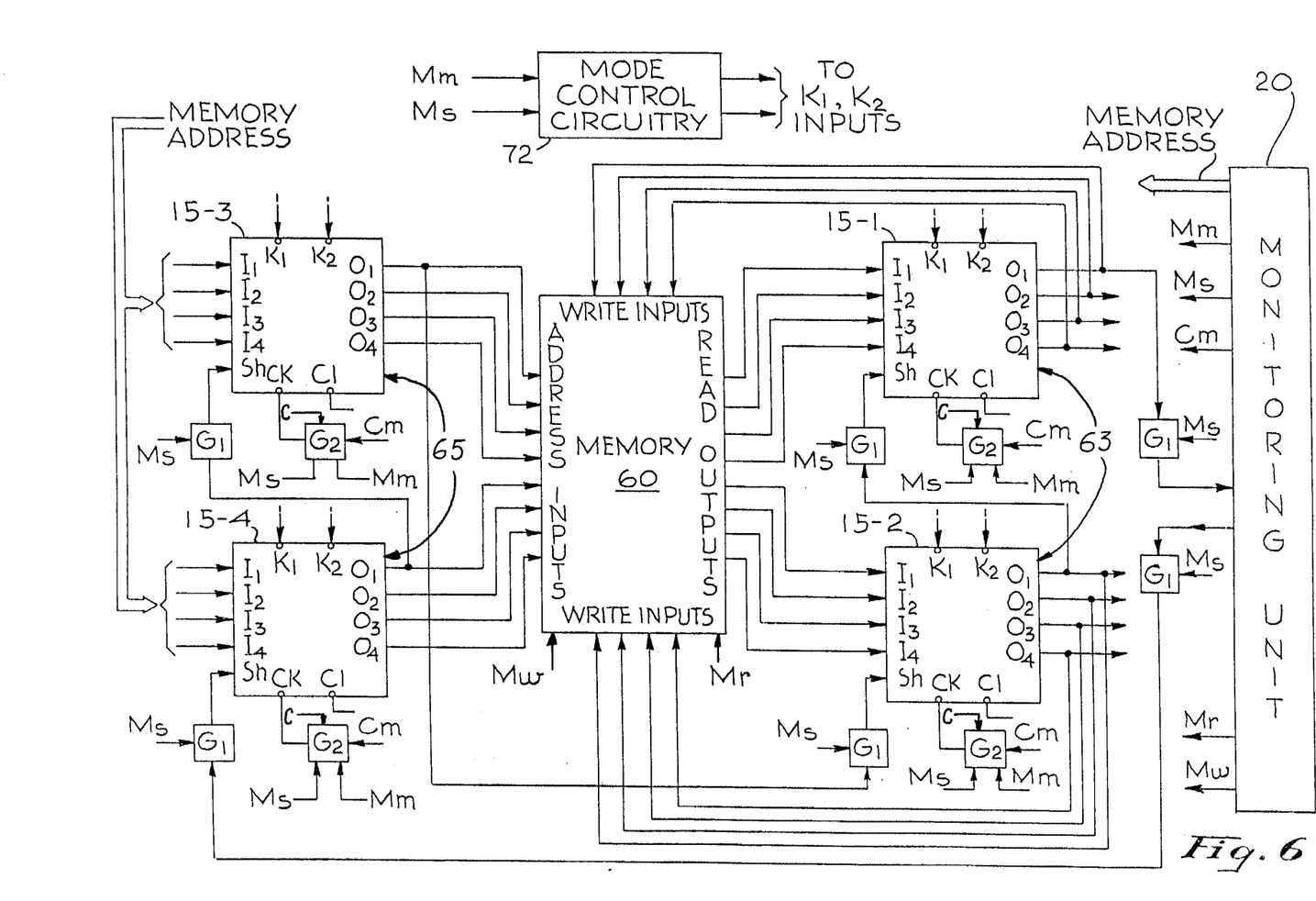
FIG. 6 is a block diagram illustrating how selectable storage states within a memory may be monitored in accordance with the invention.

Next to be considered with reference to FIG. 6 is the manner in which selectable storage states within a memory are also made accessible for monitoring purposes. FIG. 6 illustrates, for example, a memory 60 having an input-output register 63 comprised of two variable mode shift register storage devices 15-1 and 15-2, each of which is preferably of the type illustrated in FIG. 2. As also shown in FIG. 6, a memory address register 65 is also provided using two such variable mode shift register storage devices 15-3 and 15-4 which it will be seen are connected with devices 15-1 and 15-2 to form a String in the same manner as illustrated in FIG. 3. It will be understood that additional memory and String arrangements such as illustrated in FIG. 6 may be provided in a data processor. It will also be understood that one or more of the modules illustrated in FIG. 5 may include such a memory and String arrangement.

An example of typical operation will now be presented to illustrate how monitoring of selected memory states within the memory 60 may be provided in the arrangement of FIG. 6. The monitoring unit 20 first provides a memory monitoring control signal $M_m$ to clock gating circuitry G2 and to mode control circuitry 72 so as to provide for parallel loading operation—that is, $K_1K_2=11$—of the variable mode shift register storage devices 15-1 and 15-2 making up the input-output register 63 and the variable mode shift register devices 15-3 and 15-4 making up the address register 65. The monitoring unit 20 then provides for the loading into the address register 65 of the memory address corresponding to the selected memory states which are to be monitored. The monitoring unit 20 then provides a memory read signal $M_r$ which causes the memory 60 to read out the thus selected memory states which are loaded into the input-output register 63. The monitoring unit 20 next selects the string containing the variable mode shift register storage devices 15-1, 15-2, 15-3 and 15-4 and provides for shift mode operation thereof in the same manner as previously described herein, whereby the selected memory states read into the input-output register 63 are fed to the monitoring unit and returned as also previously described herein. If a correction is provided by the monitoring unit, then, following the return of the respective bits to the variable mode shift register devices 15-1, 15-2, 15-3 and 15-4, the monitoring unit 20 provides a memory write signal $M_w$ which causes the corrected memory states returned to the memory input-output register 63 to be written into the memory 60 at the originally addressed location initially loaded into address register 65.

It will be understood with reference to the exemplary embodiment of the monitoring unit illustrated in FIG. 4 that the control signals $M_m$, $M_r$ and $M_w$ and the memory address provided by the monitoring unit for use in the illustrative embodiment of FIG. 6 may be obtained from the decoder 30 in FIG. 4 as a result of decoding a monitoring instruction which is specifically provided to include such signals in order to provide for the memory monitoring operation described. It will also be understood with reference to FIG. 4 that, in response to such a monitor instruction, the decoder 30 causes the monitor clock generator 36 to provide appropriate clock signals for use in loading the memory address register 65 and the input-output register 63 in FIG. 6 as well as providing clock pulses for shifting purposes as previously described.

Although the description herein has primarily been concerned with particular embodiments and examples of the invention, it is to be understood that the invention is subject to a wide variety of possible modifications and variations without departing from the true scope thereof. Accordingly, the present invention should be considered as encompassing all possible modifications, variations and alternative implementations coming within the broad scope of the invention as defined by the appended claims.

What is claimed is:

1. In a digital data processing system, the combination comprising:
a selectively addressable memory;
addressing means for said memory;
a memory output register comprising a plurality of multiple bit storage devices;
said memory being operative to read out selected storage states at locations selectd by said addressing means into said memory output register;
a plurality of multiple bit storage devices in addition to those comprising said memory output register; and
logic circuitry interconnecting said storage devices including those comprising said memory output register for the performance of data processing operations by said system;
said logic circuitry including gating means for interconnecting said storage devices including those comprising said memory output register into a plurality of separately selectable strings; and
monitoring means for performing monitoring of digital data applied thereto from a selected string;
said monitoring means including means providing a memory address for said addressing means for use in reading out selected memory states into said memory output register;
said monitoring means also including means for selectably generating one of a plurality of monitor enable signals along with a predetermined plurality of monitor clock signals which are applied to said gating means and to the storage devices of a selected string corresponding to the applied monitor enable signal so as to cause the states thereof to be propagated to and from said monitoring means with the storage devices of the selected string being returned to (their original) states determined by said monitoring means.

2. The invention in accordance with claim 1, wherein (said) the particular predetermined plurality of monitor clock signals (are chosen so as to be equal to the) generated by said monitoring means is determined by the total number of bits contained in the selected string.

3. The invention in accordance with claim 1, wherein said monitoring means includes means for changing as well as monitoring the bits of the selected string applied thereto.

4. The invention in accordance with claim 3, wherein said monitoring means further includes means for selectively causing bits returned to said memory output register from said monitoring means to be written into selected locations of said memory.

5. The invention in accordance with claim 4, wherein said monitoring means includes means for determining whether the bits of the applied string are correct and if not for returning corrected bits to said storage devices.

6. The invention in accordance with claim 1, 2, 3, 4, or 5, wherein said gating means is responsive to a monitor enable signal to cause interconnection of the inputs and outputs of a predetermined plurality of storage devices corresponding to the applied monitor enable signal so as to form a serial string coupled to said monitoring means and along which string the bits constituting the states of the storage devices in the string are shifted in response to said monitor clock signals.

7. The invention in accordance with claim 6, wherein the memory output register storage devices are in the same string.

8. The invention in accordance with claim 7, wherein said addressing means also comprises a plurality of storage devices which are in the same string as said memory output register storage devices.

9. The invention in accordance with claim 1, 2, 3, 4 or 5, wherein said storage devices including said memory output register storage devices are provided using variable mode shift register storage devices, each shift register storage device having a clock signal input, a plurality of inputs for receiving digital data to be stored in response to an applied clock signal, a corresponding plurality of outputs providing for the outputting of the stored digital data, a shift input for receiving digital data for serial shifting through the shift register storage device in response to applied clock signals, and at least one mode control input for receiving mode control data for determining whether the shift register storage device is to operate in a normal mode in which it serves to provide digital storage for said data processing system or is to operate in a shift mode in which data applied to its shift input is serially shifted therethrough.

10. The invention in accordance with claim 9, wherein said gating means is responsive to a monitor enable signal to cause interconnection of a predetermined plurality of said variable mode shift register storage devices corresponding to the applied monitor enable signal so as to form a serial string coupled to said monitoring means and along which string the bits constituting the states of the stored data are shifted in response to applied clock signals and mode control data indicating shift mode operation.

11. The invention in accordance with claim 9, wherein said monitoring means includes means for applying mode control data to said memory output register storage devices to provide normal mode operation thereof for receiving said selected storage states read out from said memory.

* * * * *

UNITED STATES PATENT AND TRADEMARK OFFICE
CERTIFICATE OF CORRECTION

PATENT NO. : 4,326,290

DATED : April 20, 1982

INVENTOR(S) : Sheila G. Davis, et al

It is certified that error appears in the above—identified patent and that said Letters Patent is hereby corrected as shown below:

Col. 3, line 23, change "5-bit" to --4-bit--;
Col. 3, line 33, change "$M_2$" to --$M_s$--.
Col. 6, line 37, change "selectd" to --selected--;
Col. 6, line 65, delete "(their original)"
      line 68, delete "(said)"
Col. 7, line 1, delete "(are chosen so as to be equal to the)"

Signed and Sealed this

Sixteenth Day of November 1982

[SEAL]

Attest:

GERALD J MOSSINGHOFF

Attesting Officer     Commissioner of Patents and Trademarks

UNITED STATES PATENT AND TRADEMARK OFFICE
CERTIFICATE OF CORRECTION

PATENT NO. : 4,326,290

DATED : April 20, 1982

INVENTOR(S) : Sheila G. Davis et al

It is certified that error appears in the above-identified patent and that said Letters Patent is hereby corrected as shown below:

The term of this patent subsequent to March 30, 1999, has been disclaimed.

Signed and Sealed this

Sixth Day of September 1983

[SEAL]

Attest:

Attesting Officer

GERALD J. MOSSINGHOFF

Commissioner of Patents and Trademarks